(12) United States Patent
Wijekoon et al.

(10) Patent No.: US 9,439,316 B2
(45) Date of Patent: Sep. 6, 2016

(54) SUBMERSIBLE POWER DISTRIBUTION SYSTEM AND METHODS OF ASSEMBLY THEREOF

(71) Applicant: General Electric Company, Schenectady, NY (US)

(72) Inventors: Piniwan Thiwanka Bandara Wijekoon, Bavaria (DE); Christof Martin Sihler, Bavaria (DE); Stefan Schroeder, Bavaria (DE); Mark Aaron Chan, Bavaria (DE)

(73) Assignee: General Electric Company, Niskayuna, NY (US)

( * ) Notice: Subject to any disclaimer, the term of this patent is extended or adjusted under 35 U.S.C. 154(b) by 111 days.

(21) Appl. No.: 14/244,170

(22) Filed: Apr. 3, 2014

(65) Prior Publication Data
US 2015/0289403 A1    Oct. 8, 2015

(51) Int. Cl.
| | |
|---|---|
| *H02B 7/01* | (2006.01) |
| *H05K 7/02* | (2006.01) |
| *H05K 13/00* | (2006.01) |
| *E21B 33/035* | (2006.01) |

(52) U.S. Cl.
CPC ............ *H05K 7/02* (2013.01); *E21B 33/0355* (2013.01); *H02B 7/01* (2013.01); *H05K 13/0023* (2013.01); *Y10T 29/49117* (2015.01)

(58) Field of Classification Search
None
See application file for complete search history.

(56) References Cited

U.S. PATENT DOCUMENTS

| | | | |
|---|---|---|---|
| 5,544,035 A | * | 8/1996 | Beriger ................. H02M 7/003 363/132 |
| 6,142,090 A | | 11/2000 | Jakuba et al. |
| 6,175,163 B1 | | 1/2001 | Rinaldi et al. |
| 6,645,016 B1 | | 11/2003 | Andersen et al. |
| 8,439,080 B2 | | 5/2013 | Uusipaikka |
| 2010/0139544 A1 | * | 6/2010 | Bo ........................... B63G 8/08 114/337 |
| 2011/0088738 A1 | | 4/2011 | Bo |

(Continued)

FOREIGN PATENT DOCUMENTS

| | | |
|---|---|---|
| CN | 202978677 U | 6/2013 |
| EP | 1963616 A1 | 9/2008 |

(Continued)

OTHER PUBLICATIONS

Einar, "Design of an Electric X-Mas Tree Gate Valve Actuator", Norwegian University of Science and Technology Department of Engineering Cybernetics, pp. 1-89, Jun. 2007.

(Continued)

*Primary Examiner* — Courtney Smith
(74) *Attorney, Agent, or Firm* — Nitin N. Joshi (57) ABSTRACT

A submersible power distribution system is provided. The system includes at least one receptacle configured to be exposed to an underwater environment and a plurality of power conversion modules positioned within the at least one receptacle. Each of the plurality of power conversion modules includes a first enclosure configured to be exposed to the underwater environment, the first enclosure defining a first interior cavity configured to have a first pressure. Power conversion modules also include at least one second enclosure positioned within the first interior cavity. The at least one second enclosure defines a second interior cavity configured to have a second pressure that is lower than the first pressure. The at least one second enclosure is configured to restrict exposure of non-pressure-tolerant power electronics in the second interior cavity to the first pressure.

19 Claims, 4 Drawing Sheets

(56) References Cited

U.S. PATENT DOCUMENTS

| | | |
|---|---|---|
| 2012/0267955 A1 | 10/2012 | Zhan et al. |
| 2013/0026831 A1 | 1/2013 | Sihler et al. |
| 2013/0056181 A1 | 3/2013 | Baerd et al. |
| 2015/0188315 A1* | 7/2015 | Hytten .................. H02J 1/10 307/18 |
| 2015/0200609 A1* | 7/2015 | Hytten .................. H02J 3/36 219/488 |

FOREIGN PATENT DOCUMENTS

| | | |
|---|---|---|
| WO | 9920872 A1 | 4/1999 |
| WO | 2005111484 A2 | 11/2005 |
| WO | 2012034984 A2 | 3/2012 |
| WO | 2012141599 A1 | 10/2012 |
| WO | 2013103711 A2 | 7/2013 |

OTHER PUBLICATIONS

Hernes et al., "Enabling Pressure Tolerant Power Electronic Converters for Subsea Applications", Sintef Energy Research, pp. 1-10, 2009.

Pittini et al., "Pressure Tolerant Power Electronics for Deep and Ultra-Deep Water", Offshore Technology Conference, May 2-5, 2011, Houston, Texas, pp. 1-10, 2011.

European Search Report and Written Opinion issued in connection with corresponding Application No. 15162144.8 on Jun. 13, 2016.

* cited by examiner

SUBMERSIBLE POWER DISTRIBUTION SYSTEM AND METHODS OF ASSEMBLY THEREOF

BACKGROUND

The present disclosure relates generally to power transmission and distribution and, more specifically, to power conversion modules for use in an underwater environment.

As oil and gas fields in shallow waters diminish, e.g., water depths less than approximately 500 meters (m) (1640 feet (ft.)), producers are tapping offshore fields in deeper waters, e.g., water depths of 500 m (1640 ft.) and greater. Such deep water fields not only include oil and gas production installations that operate far below the surface of the sea, but, also far away from the shore, e.g., greater than approximately 300 kilometers (km) (186 miles (mi)).

In many known subsea oil and gas production systems, typical equipment for such subsea oil and gas recovery and production includes gas compressors and pumps. Electric variable speed drive (VSD) and motor systems are one way to directly power such equipment in deep water environments. Reliable delivery of electric power from a remote utility grid or power generation source facilitates reliable production and processing of oil and gas in subsea locations. Typically, the transmission power requirement may be approximately one hundred megawatts for medium to large oil/gas fields.

As such, some known subsea oil and gas production systems are electric power intensive, and a robust, sturdy, and reliable electrical transmission and distribution (T&D) is required. Therefore, some known subsea oil and gas production systems use alternating current (AC) transmission and distribution systems for delivery of electric power to subsea locations. Such systems typically deliver AC power from a platform or terrestrial location to a subsea transformer through a power cable. Power is transferred from the subsea transformer to subsea AC switchgear through another power cable. The subsea AC switchgear feeds AC power to one or more subsea VSDs through yet another cable, or to other types of electrical loads. The VSDs each provide variable frequency AC power to electric motors through a power cable. Such AC transmission and distribution systems face technical challenges, which become more significant when the transmission distance is in excess of one hundred kilometers. For example, the significant reactive power drawn from the distributed subsea cable capacitance restrains the power delivery capability as well as increases the system cost.

Therefore, subsea oil and gas production systems may instead use high-voltage direct current (HVDC) transmission and distribution systems for delivery of electric power to subsea locations. Such HVDC systems typically include a land-based or topside converter substation where the AC-to-DC power conversion is performed. Also, these HVDC T&D systems may include undersea DC-to-AC and DC-to-DC converter stations proximate the subsea oil and gas production systems.

Active subsea power electronics components are generally contained inside enclosures (e.g. pressure vessels) protecting them from the surrounding subsea environment. Such known enclosures are pressurized to about 1 bar to enable at least some of the active subsea power electronics components to operate satisfactorily at increasing underwater depths. As the operating depths of undersea DC-to-AC and DC-to-DC converter stations increases, at least some known enclosures are being fabricated from more robust materials to facilitate withstanding increasing pressure differentials between the subsea environment and within the enclosures. Moreover, the enclosures are becoming increasingly large as required converter power ratings increase. Accordingly, known subsea enclosures operating in underwater environments of increasing depths are generally very large and heavy, which makes service and/or repair of the converter stations difficult.

BRIEF DESCRIPTION

In one aspect, a submersible power distribution system is provided. The system includes at least one receptacle configured to be exposed to an underwater environment and a plurality of power conversion modules positioned within the at least one receptacle. Each of the plurality of power conversion modules includes a first enclosure configured to be exposed to the underwater environment, the first enclosure defining a first interior cavity configured to have a first pressure. Power conversion modules also include at least one second enclosure positioned within the first interior cavity. The at least one second enclosure defines a second interior cavity configured to have a second pressure that is lower than the first pressure. The at least one second enclosure is configured to restrict exposure of non-pressure-tolerant power electronics in the second interior cavity to the first pressure.

In another aspect, a power conversion module for use in an underwater environment is provided. The module includes a first enclosure configured to be exposed to the underwater environment, the first enclosure defining a first interior cavity configured to have a first pressure. The module also includes at least one second enclosure positioned within the first interior cavity. The at least one second enclosure defines a second interior cavity configured to have a second pressure that is lower than the first pressure. The at least one second enclosure is configured to restrict exposure of non-pressure-tolerant power electronics in the second interior cavity to the first pressure.

In yet another aspect, a method of assembling a power conversion module is provided. The method includes providing a first enclosure configured to be exposed to an underwater environment, the first enclosure defining a first interior cavity configured to have a first pressure. The method also includes providing at least one second enclosure defining a second interior cavity configured to have a second pressure that is lower than the first pressure, identifying non-pressure-tolerant power electronics of the power conversion module, positioning the non-pressure-tolerant power electronics within the second interior cavity, and positioning the at least one second enclosure within the first interior cavity. The at least one second enclosure is configured to restrict exposure of the non-pressure-tolerant power electronics in the second interior cavity to the first pressure of the first interior cavity.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, Such ranges are identified and include all the sub-ranges contained therein unless context or language indicates otherwise.

Embodiments of the present disclosure relate to submersible power distribution systems including modularized power electronics enclosures. In the exemplary embodiment, underwater-based direct current (DC)-to-DC and DC-to-alternating current (AC) power converters are modularized to facilitate service and repair of the converters, and to facilitate reducing an overall weight of a submersible power distribution system. For example, each module includes a first enclosure exposed to an underwater environment, and that houses at least one second enclosure and pressure-tolerant power electronics of the converter. The at least one second enclosure houses non-pressure-tolerant power electronics of the converter. Interior cavities of the second enclosures are pressurized at a lower pressure than an interior cavity of the first enclosure such that the non-pressure-tolerant components can operate satisfactorily at increasingly pressurized underwater depths. By identifying and isolating the non-pressure-tolerant power electronics from the pressure-tolerant components, and by housing the non-pressure-tolerant components in compact secondary enclosures, the diameter and side wall thickness of the first enclosure can be reduced. As such, the power converters described herein have a reduced weight relative to conventional subsea power converters.

Figure 1:
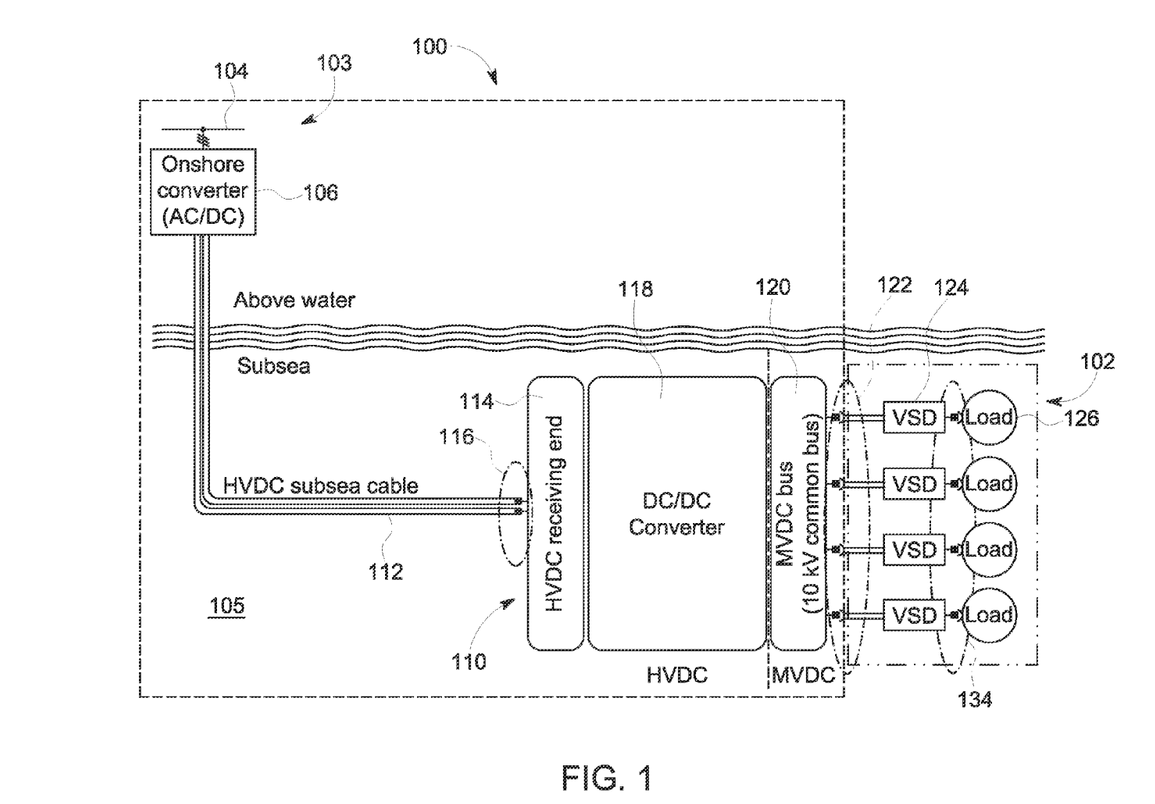
FIG. 1 is a schematic block diagram of an exemplary submersible power system and a portion of an exemplary set of electrical loads.
Figure 2:
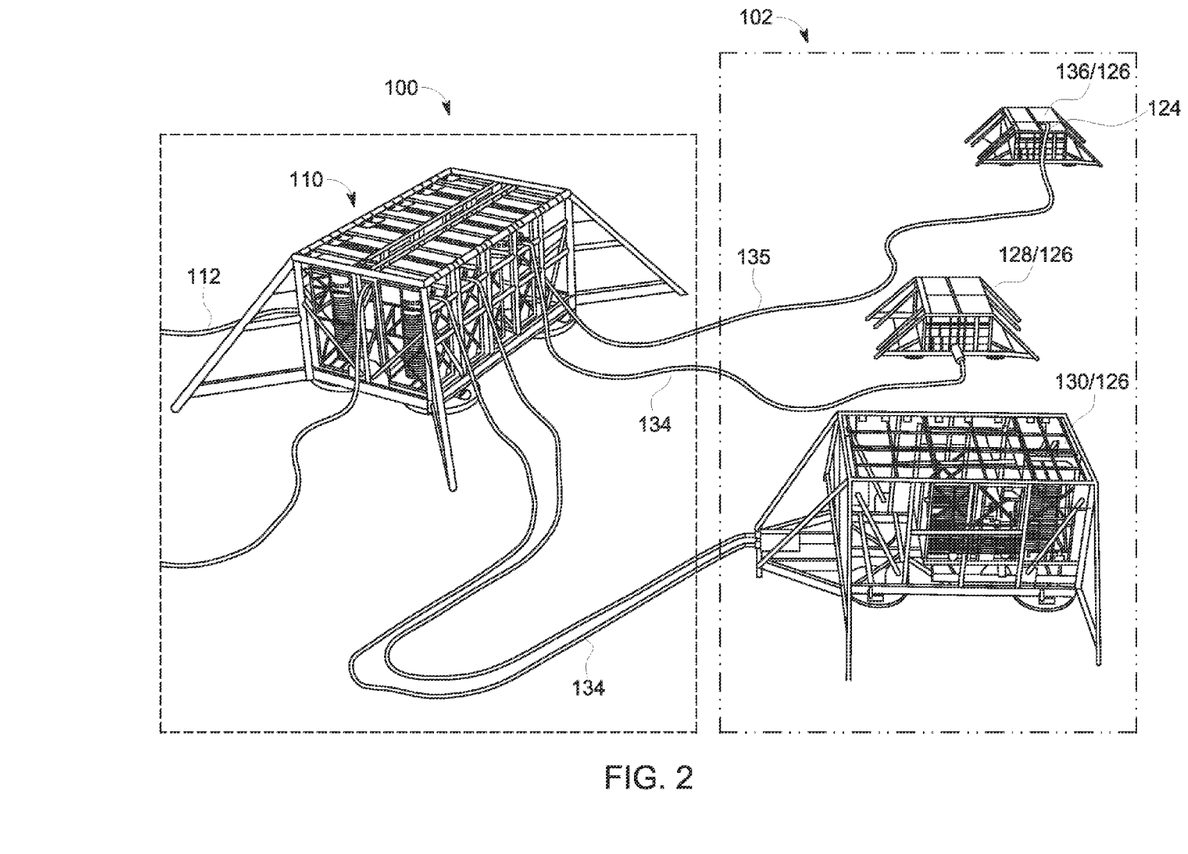
FIG. 2 is a perspective view of the submersible power system and the electrical loads shown in FIG. 1.

FIG. 1 is a schematic block diagram of an exemplary submersible power system 100 and a portion of a plurality of electrical loads 126, e.g., without limitation, an exemplary submersible resource recovery system 102. FIG. 2 is a perspective view of submersible power system 100 and submersible resource recovery system 102. In the exemplary embodiment, submersible power system 100 is shown as a stand-alone system supporting electrical loads 126 in submersible resource recovery system 102. Alternatively, submersible power system 100 distributes electric power to electric loads 126 for any operation requiring electric power in an underwater environment 105. Submersible resource recovery system 102 is any resource recovery system that enables operation of submersible power system 100 as described herein including, without limitation, subsea oil and gas production systems.

Submersible power system 100 is powered by a DC power source 103. In the exemplary embodiment, DC power source 103 is a platform based AC to DC power converter that converts AC power from an AC power source 104, e.g., without limitation, an AC power grid, to DC power. In other embodiments, DC power source 103 may be a land-based DC power source, a DC power generator (whether land or platform based), or any other suitable DC power source. Also, in the exemplary embodiment, submersible power system 100 includes a land-based AC-to-DC converter 106 coupled to AC source 104. AC-to-DC converter 106 receives AC power and generates and transmits high voltage DC (HVDC) electric power at any voltage and any polarity that enables operation of submersible resource recovery system 102 and submersible power system 100 as described herein, e.g., without limitation, within a range between approximately ±50 kiloVolts (kV) and approximately ±100 kV. System 100 also includes at least one submersible power distribution system 110 (only one shown) coupled to AC-to-DC converter 106 through an HVDC umbilical cable 112.

Submersible power distribution system 110 includes an HVDC receiving end 114 coupled to HVDC umbilical cable 112 through a plurality of dry-mateable connectors 116. System 110 also includes a DC-to-DC converter section 118 coupled to HVDC receiving end 114. DC-to-DC converter section 118 converts the HVDC voltage to medium voltage DC (MVDC), e.g., and without limitation, approximately ±10 kV. System 110 further includes a MVDC bus 120 coupled to DC-to-DC converter section 118. System 110 also includes a plurality of wet-mateable connectors 122. In alternative embodiments, a DC-to-AC converter section is used rather than DC-to-DC converter section 118.

Submersible resource recovery system 102 includes a plurality of variable speed drive (VSD) units 124 coupled to MVDC bus module 120 through wet-mateable connectors 122. Each VSD unit 124 is coupled to an electric power consuming device, i.e., one of loads 126, e.g., without limitation, electrical motors driving pumping station 128 and compressor station 130 through wet-mateable connector 122 and subsea AC cable 134. System 102 may also include other devices coupled directly to MVDC bus module 120 through a subsea MVDC cable 135, including, without limitation, a remote station 136 including its own local VSD unit 124.

Figure 3:
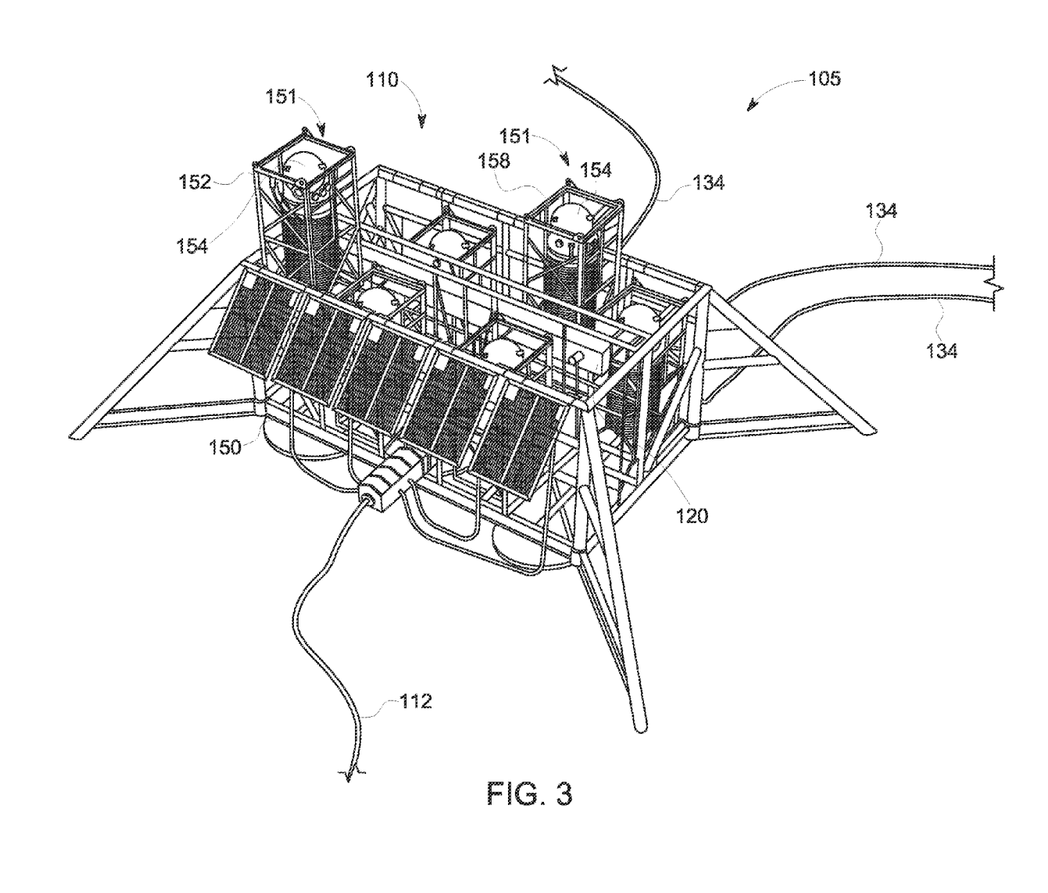
FIG. 3 is a perspective view of an exemplary submersible power distribution system that may be used with the submersible power system shown in FIG. 2.

FIG. 3 is a perspective view of submersible power distribution system 110. System 110 includes a receptacle 150 exposed to underwater environment 105 with a subsea template, i.e., receptacle 150 is open to water (not shown). System 110 also includes a plurality of power conversion modules 151 removably positioned within receptacle 150. More specifically, in the exemplary embodiment, system 110 includes a plurality of DC-to-DC power conversion modules 152 removably positioned within receptacle 150, and a plurality of variable speed drive (VSD) modules 158 removably positioned within receptacle 150. DC-to-DC power conversion modules 152 form DC-to-DC converter section 118 (shown in FIG. 1). Each power conversion module 151 includes a first enclosure 154 configured to be exposed to underwater environment 105. In some embodiments, first enclosure 154 is a pressure vessel. Each power conversion module 151 also includes an interior cavity that houses power electronics (neither shown in FIG. 3), discussed further below.

VSD modules 158 include first enclosure 154 housing VSD unit 124 (shown in FIG. 1). In the exemplary embodiment, system 110 includes three DC-to-DC power conversion modules 152 and three VSD modules 158. In other embodiments, system 110 includes more or fewer subsea DC-to-DC power conversion modules 152 and/or VSD modules 158. DC-to-DC power conversion modules 152 and VSD modules 158 may have any power rating that enables system 110 to function as described herein. Moreover, the number of power conversion modules 151 is generally selected based on the total accumulated size of the powered loads. Additional power conversion modules 151 may be included in one receptacle 150 to provide back-up redundancy in case of failure of one or several power conversion modules 151. Also, in some embodiments, a plurality of receptacles 150 are used and each receptacle is configured to receive only one or several subsea power conversion modules 151.

Figure 4:
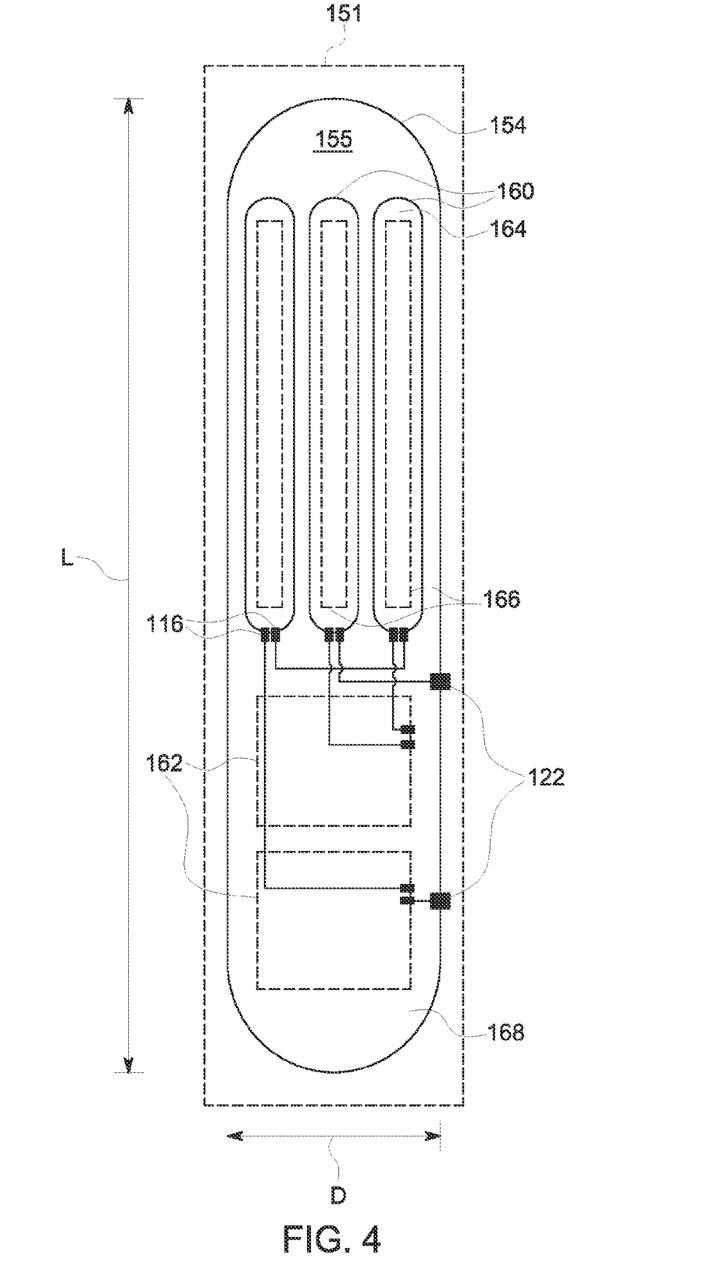
FIG. 4 is a schematic diagram of an exemplary enclosure that may be used with the power conversion modules shown in FIG. 3.

FIG. 4 is a schematic diagram of an exemplary power conversion module 151. More specifically, in the exemplary embodiment, power conversion module 151 is a DC-to-DC power conversion module 152 (shown in FIG. 3). Power conversion module 151 includes first enclosure 154 defining a first interior cavity 155, and at least one second enclosure 160 positioned within first interior cavity 155. In some embodiments, a plurality of second enclosures 160 are positioned within first interior cavity 155, as will be described in more detail below. While shown as including three enclosures 160, any number of enclosures 160 may be positioned in first interior cavity 155 that enables power conversion module 151 to function as described herein.

In the exemplary embodiment, first interior cavity 155 of first enclosure 154 receives second enclosures 160 and pressure-tolerant power electronics 162, and a second interior cavity 164 of each second enclosure 160 receives non-pressure-tolerant power electronics 166. As used herein, "pressure-tolerant power electronics" refers to electronic components that can, or that can be easily made to, operate satisfactorily when subjected to pressures above about one bar. Exemplary pressure-tolerant power electronics 162 include, but are not limited to, inductors, resistors, transformers, filter coils, mechanical switches, connectors, cables, capacitors, and busbars. Moreover, as used herein, "non-pressure-tolerant power electronics" refers to electronic components that are unable, difficult, or costly to be made to operate satisfactorily when subjected to pressures above about one bar. Exemplary non-pressure-tolerant power electronics 166 include, but are not limited to, active semiconductor devices (i.e., insulated-gate bipolar transistors (IGBT), integrated gate-commutated thyristors (IGCT), metal-oxide-semiconductor field-effect transistors (MOSFET)), related controllers for the active semiconductor devices, gate drivers, optical receivers, optical transmitters, and sensors.

First interior cavity 155 is at a first pressure and second interior cavity 164 is at a second pressure that is lower than the first pressure. Pressure-tolerant components 162 are housed in first enclosure 154 at the first pressure, and non-pressure-tolerant components 166 are housed in second enclosure 160 at the second pressure. Second enclosure 160 restricts exposure of non-pressure-tolerant power electronics 166 in second interior cavity 164 to the first pressure of first interior cavity 155. Moreover, first enclosure 154 is exposed to a third pressure of underwater environment 105. A magnitude of the third pressure is based on a depth of receptacle 150 (shown in FIG. 3) and first enclosure 154 in underwater environment 105. In the exemplary embodiment, first enclosure 154 is pressurized at the first pressure to be substantially equalized with the third pressure of underwater environment 105. Alternatively, first enclosure 154 may be pressurized at any pressure that enables power conversion modules 151 to function as described herein.

In some implementations, first interior cavity 155 of first enclosure 154 is at least partially filled with dielectric liquid 168 to pressurize first interior cavity 155. Exemplary dielectric liquids 168 include, but are not limited to, transformer oil and silicon oil. At least partially filling first interior cavity 155 with dielectric liquid 168 facilitates maintaining the substantially equalized pressure between first interior cavity 155 and underwater environment 105. Moreover, first enclosure 154 is at least partially filled with dielectric liquid 168 such that second enclosures 160 are at least partially submerged in dielectric liquid 168. By submerging second enclosures 160 in dielectric liquid 168, heat generated by non-pressure-tolerant power electronics 166 is conducted through second enclosures 160, through dielectric liquid 168, through first enclosure 154, and into underwater environment 105. Moreover, in the exemplary implementation, pressure-tolerant power electronics 162 are also at least partially submerged in dielectric liquid 168, and heat generated by pressure-tolerant power electronics 162 is likewise conducted through dielectric liquid 168 and towards underwater environment 105.

In the exemplary embodiment, a first differential pressure is defined between the first pressure of first interior cavity 155 and the third pressure of underwater environment 105, and a second differential pressure is defined between the first pressure and the second pressure of second interior cavity 164. For example, if first interior cavity 155 is pressurized at about 450 bar, and second interior cavity 164 is pressurized at about 1 bar, the first differential pressure is less than about 1 bar, and the second differential pressure is up to about 450 bar. As such, the dimensions of first enclosure 154 and second enclosure 160 are based at least partially on the first and second pressure differentials and, more specifically, to the ability of first enclosure 154 and second enclosure 160 to withstand the first and second pressure differentials.

First enclosure 154 has any suitable shape and dimensions that enable power conversion modules 151 to function as described herein. In the exemplary embodiment, first enclosure 154 has a substantially tubular shape having a length L and a diameter D. The shape and dimensions of first enclosure 154 are selected based on at least one of an operating depth of submersible power distribution system 110, the material used to fabricate first enclosure 154, and the differential pressure between the first pressure of first interior cavity 155 and the pressure of underwater environment 105 at the operating depth of submersible power distribution system 110. For example, the length to diameter (L/D) ratio of first enclosure 154 can be increased to enable submersible power distribution system 110 to operate in increasing underwater depths. In some implementations, the L/D ratio of first enclosure 154 is at least about 5-to-1. Moreover, for example, if first interior cavity 155 is pressurized to be substantially equalized with the pressure of underwater environment 105 at operating depths of system 110, a side wall thickness (not shown) of first enclosure 154 can be reduced to facilitate reducing an overall weight of each module 151.

Second enclosure 160 has any suitable shape and dimensions that enable power conversion modules 151 to function as described herein. In the exemplary embodiment, second enclosure 160 has a substantially tubular shape and a greater side wall thickness (not shown) than first enclosure 154. More specifically, the shape and dimensions of second enclosure 160 are selected based on at least one of the pressure within first interior cavity 155, and the differential pressure between the first pressure of first interior cavity 155 and the second pressure of second interior cavity 164. As described above, the differential pressure between first interior cavity 155 and second interior cavity 164 can be up to about 450 bar. As such, the dimensions of second enclosure 160 are modified to increase the side wall thickness of second enclosure 160, for example, to facilitate withstanding the differential pressure between first interior cavity 155 and second interior cavity 164.

In the exemplary embodiment, a plurality of second enclosures 160 are positioned within first interior cavity 155. Second enclosures 160 may be arranged within first interior cavity 155 in any configuration that enables system 110 to function as described herein. Because the dimensions of second enclosures 160 are selected at least partially on the ability of second enclosures 160 to withstand comparatively large pressure differential pressures, space within each second enclosure 160 may be limited. Accordingly, in some embodiments, multiple second enclosures 160 housing non-pressure-tolerant power electronics 166 may be required to generate a suitable power rating. In the exemplary embodiment, non-pressure-tolerant power electronics 166 from each second enclosure 160 are coupled together in electrical communication through dry-mateable connectors 116. Moreover, pressure-tolerant power electronics 162 and non-pressure-tolerant power electronics 166 are coupled together in electrical communication through dry-mateable connectors 116 to form a power converter (not shown).

Moreover, pressure-tolerant power electronics 162 and non-pressure-tolerant power electronics 166 are coupled in electrical communication with electrical components (not shown) outside of first enclosure 154 through wet-mateable connectors 122 coupled to first enclosure 154 and that extend between first interior cavity 155 and underwater environment 105. Wet-mateable connectors 122 enable each power conversion module 151 to be individually disconnected from submersible power distribution system 110 to facilitate service and repair thereof. Because the pressures of first enclosure 154 and underwater environment 105 are substantially equalized, wet-mateable connectors 122 are less complex and less costly than wet-mateable connectors subjected to a substantially large differential pressure.

The systems and methods described herein facilitate reducing the weight of subsea power electronics enclosures. In the exemplary embodiments, pressure-tolerant and non-pressure-tolerant power electronics of a power conversion module are identified and separated from each other. The pressure-tolerant power electronics are housed in a first enclosure pressurized at a first pressure, and the non-pressure-tolerant power electronics are housed in a second enclosure positioned within the first enclosure and pressurized at a second pressure. The first pressure is substantially equalized to the pressure of an underwater environment at operating depths of the power conversion module, and the second pressure is lower than the first pressure to enable the non-pressure-tolerant power electronics to operate satisfactorily in the underwater environment. By compartmentalizing the non-pressure-tolerant power electronics into smaller secondary enclosures and by substantially equalizing the pressure between the first enclosure and the underwater environment, the dimensions of the first and second enclosures can be selected to reduce the weight of the power conversion module.

An exemplary technical effect of the systems and methods described herein includes at least one of (a) substantially reducing the weight of subsea power conversion enclosures; (b) enhancing cooling of heat-generating power conversion components; and (c) enabling modularization of various power converters to facilitate service and repair of the converters.

Exemplary embodiments of the submersible power distribution system are described above in detail. The system is not limited to the specific embodiments described herein, but rather, components of systems and/or steps of the methods may be utilized independently and separately from other components and/or steps described herein. For example, the modules described herein may also be used in combination with other processes, and is not limited to practice with only the submersible power distribution system and methods as described herein. Rather, the exemplary embodiment can be implemented and utilized in connection with many applications where performing operations in subsea environments is desired.

Although specific features of various embodiments of the present disclosure may be shown in some drawings and not in others, this is for convenience only. In accordance with the principles of embodiments of the present disclosure, any feature of a drawing may be referenced and/or claimed in combination with any feature of any other drawing.

This written description uses examples to disclose the embodiments of the present disclosure, including the best mode, and also to enable any person skilled in the art to practice embodiments of the present disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A submersible power distribution system comprising:
   at least one receptacle exposed to an underwater environment;
   a plurality of power conversion modules positioned within said at least one receptacle, wherein each of said plurality of power conversion modules comprises:
      a first enclosure exposed to the underwater environment, said first enclosure defining a first interior cavity having a first pressure;
      at least one second enclosure positioned within said first interior cavity, said at least one second enclosure defining a second interior cavity having a second pressure that is lower than the first pressure, said at least one second enclosure restricting exposure of non-pressure-tolerant power electronics in said second interior cavity to the first pressure; and a wet-mateable connector coupled to said first enclosure and extending between said first interior cavity and the underwater environment.

2. The system in accordance with claim 1 further comprising more than one second enclosures positioned within said first interior cavity of said first enclosure, wherein the non-pressure-tolerant power electronics from each of the more than one second enclosures are coupled together in electrical communication.

3. The system in accordance with claim 1, wherein the non-pressure-tolerant power electronics comprise at least one of active semiconductor devices, controllers, gate drivers, optical receivers, optical transmitters, and sensors.

4. The system in accordance with claim 1, wherein a first pressure differential between the first and second pressures is less than or equal to about 450 bar.

5. The system in accordance with claim 1, wherein the underwater environment is at a third pressure substantially equal to the first pressure of the first enclosure.

6. The system in accordance with claim 1, wherein said first interior cavity of said first enclosure is at least partially filled with dielectric liquid such that said at least one second enclosure is at least partially submerged in the dielectric liquid.

7. The system in accordance with claim 1, wherein said first enclosure is configured to house pressure-tolerant power electronics in said first interior cavity.

8. The system in accordance with claim 7, wherein pressure-tolerant power electronics comprise at least one of inductors, resistors, transformers, filter coils, mechanical switches, connectors, cables, capacitors, and busbars.

9. A power conversion module for use in an underwater environment, said module comprising:
a first enclosure exposed to the underwater environment, said first enclosure defining a first interior cavity having a first pressure;
at least one second enclosure positioned within said first interior cavity, said at least one second enclosure defining a second interior cavity having a second pressure that is lower than the first pressure, said at least one second enclosure to restrict exposure of non-pressure-tolerant power electronics in said second interior cavity to the first pressure; and
a wet-mateable connector coupled to said first enclosure and extending between said first interior cavity and the underwater environment.

10. The module in accordance with claim 9, wherein said first enclosure has a length-to-diameter ratio of at least about 5-to-1.

11. The module in accordance with claim 9, wherein a second pressure differential between the first pressure and a third pressure of the underwater environment is less than about 1 bar.

12. The module in accordance with claim 9 further comprising more than one second enclosures positioned within said first interior cavity of said first enclosure, wherein the non-pressure-tolerant power electronics from each of the more than one second enclosures are coupled together in electrical communication.

13. The module in accordance with claim 9, wherein said first interior cavity of said first enclosure is at least partially filled with dielectric liquid such that said at least one second enclosure is at least partially submerged in the dielectric liquid.

14. A method of assembling a power conversion module, said method comprising:
providing a first enclosure exposed to an underwater environment, the first enclosure defining a first interior cavity having a first pressure;
providing at least one second enclosure defining a second interior cavity having a second pressure that is lower than the first pressure;
identifying non-pressure-tolerant power electronics of the power conversion module;
positioning the non-pressure-tolerant power electronics within the second interior cavity, wherein the at least one second enclosure restricts exposure of the non-pressure-tolerant power electronics in the second interior cavity to the first pressure of the first interior cavity;
positioning the at least one second enclosure within the first interior cavity; and
coupling a wet-mateable connector to said first enclosure and extending between said first interior cavity and the underwater environment.

15. The method in accordance with claim 14, wherein providing at least one second enclosure comprises:
providing more than one second enclosures that each houses non-pressure-tolerant power electronics of the power conversion module; and
electrically coupling the non-pressure-tolerant power electronics from each of the more than one second enclosures together.

16. The method in accordance with claim 14 further comprising:
identifying pressure-tolerant power electronics of the power conversion module; and
positioning the pressure-tolerant power electronics within the first interior cavity of the first enclosure.

17. The method in accordance with claim 16 further comprising coupling the pressure-tolerant power electronics and the non-pressure-tolerant power electronics together in electrical communication to form a power converter.

18. The method in accordance with claim 14 further comprising at least partially filling the first interior cavity of the first enclosure with dielectric liquid such that the at least one second enclosure is at least partially submerged in the dielectric liquid.

19. The method in accordance with claim 14 further comprising pressurizing the first enclosure at the first pressure that is substantially equalized with a third pressure of the underwater environment.

* * * * *